(12) United States Patent  (10) Patent No.: US 8,755,212 B2
Pinkerton et al.  (45) Date of Patent: Jun. 17, 2014

(54) NON-VOLATILE GRAPHENE-DRUM MEMORY CHIP

(75) Inventors: Joseph F. Pinkerton, Austin, TX (US); David A. Badger, Lago Vista, TX (US)

(73) Assignee: Clean Energy Labs, LLC, Austin, TX (US)

( * ) Notice: Subject to any disclaimer, the term of this patent is extended or adjusted under 35 U.S.C. 154(b) by 84 days.

(21) Appl. No.: 13/512,844

(22) PCT Filed: Oct. 6, 2011

(86) PCT No.: PCT/US2011/055167
§ 371 (c)(1),
(2), (4) Date: May 30, 2012

(87) PCT Pub. No.: WO2012/051053
PCT Pub. Date: Apr. 19, 2012

(65) Prior Publication Data
US 2012/0236622 A1    Sep. 20, 2012

Related U.S. Application Data

(60) Provisional application No. 61/391,727, filed on Oct. 11, 2010.

(51) Int. Cl.
*G11C 11/00*    (2006.01)

(52) U.S. Cl.
USPC ........... 365/129; 365/63; 365/51; 365/185.21

(58) Field of Classification Search
USPC ........... 365/185.18, 185.21, 62, 51, 189.011, 365/129; 257/415
See application file for complete search history.

(56) References Cited

U.S. PATENT DOCUMENTS

| 8,218,346 B2 * | 7/2012 | Baek ................................ 365/63 |
| 8,482,087 B2 * | 7/2013 | Pinkerton ..................... 257/415 |
| 2010/0116630 A1 | 5/2010 | Pinkerton |

FOREIGN PATENT DOCUMENTS

| WO | WO 2010/039983 A2 | 4/2010 |
| WO | WO 2012/051053 A1 | 4/2012 |

OTHER PUBLICATIONS

Patent Cooperation Treaty, PCT International Search Report; Issued in Connection with International Application No. PCT/US11/55167; Jan. 18, 2012; 4 pages; Europe.

* cited by examiner

*Primary Examiner* — David Lam
(74) *Attorney, Agent, or Firm* — Greenberg Traurig, LLP; Ross Spencer Garsson

(57) ABSTRACT

The present invention relates to non-volatile memory chips having graphene drums. In some embodiments, the non-volatile memory chips have one or more layers that each includes a plurality of graphene-drum memory chip cells.

37 Claims, 9 Drawing Sheets

NON-VOLATILE GRAPHENE-DRUM MEMORY CHIP

CROSS-REFERENCE TO RELATED APPLICATIONS

This patent application is a §371 national stage patent application based on International Patent Application No. PCT/US11/55167 filed Oct. 6, 2011, entitled "NON-VOLATILE GRAPHENE-DRUM MEMORY CHIP," which claims priority to U.S. Provisional Patent Application No. 61/391,727, filed on Oct. 11, 2010, which are both incorporated herein by reference in their entirety.

TECHNICAL FIELD

The present invention relates to non-volatile memory chips having graphene drums.

SUMMARY OF THE INVENTION

Graphene membranes (also otherwise referred to as "graphene drums") have been manufactured using process such as disclosed in Lee et al. Science, 2008, 321, 385-388. PCT Patent Appl. No. PCT/US09/59266 (Pinkerton) (the "PCT US09/59366 Application") described tunneling current switch assemblies having graphene drums (which graphene drums generally having a diameter between about 500 nm and about 1500 nm). As described in the PCT US09/59366 Application, which is attached hereto at Appendix A, the graphene drum is capable of completely sealing the chamber formed by the graphene drum (i.e., the graphene drum provides a complete seal to fluids inside and outside the chamber). U.S. Patent Appl. No. 61/301,209 (Pinkerton) ("the '209 Application) described pump and engine systems having graphene drum. The '209 Application is attached hereto at Attachment B.

In embodiments of the present invention, graphene drums are employed in a non-volatile memory chip, i.e. a graphene-drum memory chip ("GDMC").

Advantages of utilizing graphene drums in a memory chip include:

a. The GDMC can have many active layers. This is because the GDMC does not require the pure silicon at the bottom of the chip like current flash devices.

b. Many memory elements can share the same input/output wiring. This is because each graphene drum within a cell has a unique mechanical resonant frequency that can be addressed by driving the entire cell with an electrical frequency that matches this mechanical frequency.

c. Each cell (which might contain 1000 graphene drums) can be addressed with just four input/output pins per layer. This can be done by selecting a unique row and column by matching the electrical input to the mechanical resonant frequency of a graphene drum that connects to a given row/column.

d. The graphene drum memory chip requires less power to read/write than flash memory because it takes less voltage (typically less than 1 volt) to read/write an array of graphene drums.

e. The power demand of the memory chip is reduced because many graphene drums within a given array can be read simultaneously by applying a DC voltage and making use of the thermal vibrations of each graphene drum (instead of driving each graphene drum with an AC signal).

f. The device will have a high read speed because many graphene drums within a cell can be read simultaneously.

g. The state of each graphene drum within an array can be rapidly changed by scrolling through a range of resonant frequencies with a voltage signal on a nearby trace.

These advantages yield a very high memory density of at least one terabyte per square centimeter (using a relatively conservative 90 nanometer feature size) and low cost per gigabyte (since the device can use lower cost "old" foundries and the gigabyte per mass of material is low).

As used herein, a "graphene-drum memory chip" (or "GDMC") is a memory chip that utilizes one or more graphene drums (such as a memory chip that utilizes an array of graphene drums). A "graphene-drum memory chip cell" is a cell of a memory chip that utilizes one or more graphene drums. A "graphene-drum memory chip layer" is a layer of a memory chip that utilizes one or more graphene drums.

Alternatively, other types of electrically conductive membranes (also referred to as "electrically conductive drums") may be utilized in lieu of graphene membranes in embodiments of the present invention, such as, for example, graphene oxide membranes.

In general, in one aspect, the invention features a memory chip that includes an array of electrically conductive drums that have a range of mechanical resonant frequencies that can be individually addressed with an electrical signal between said electrically conductive drums and a nearby electrically conductive member.

Implementations of the invention can include one or more of the following features:

The array of electrically conductive drums can be an array of graphene drums.

The memory chip can include a layer. The layer can include the array of graphene drums.

The layer can include a plurality of graphene drum memory chip cells. Each of the graphene drum memory chip cells can include at least one graphene drum.

The memory chip can further include a selection trace system. The selection trace system can include a plurality of selection traces. Each of the graphene memory chip cells can be operably connected to a corresponding pair of selection traces in the selection traces such that each of the graphene memory chip cells can be individually selected by selecting the corresponding pair of selection traces for the graphene-drum memory chip cell.

Each of the graphene drums in the plurality of graphene-drum memory chip cells can be operable to be in an "on" position and an "off" position.

The memory chip can further include a contact trace system. The contact trace system can include at least one contact trace. A graphene drum in the plurality of graphene-drum memory chip cells is in a first position when the graphene drum is contacting at least one of the contact traces in the contact trace system. The graphene drum in the plurality of graphene-drum memory chip cells is in a second position when the graphene drum is not contacting at least one of the contact traces in the contact trace system. The first position and the second position are either (a) the "on" position and the "off" position, respectively, or (b) the "off" position and the "on" position; respectively.

The memory chip further includes a voltage source and an external circuitry. The voltage source can be operable to apply a voltage such that the external circuitry can determine whether the graphene drum memory chip cell of the plurality of graphene-drum memory chip cells is in the "on" or "off" position.

The memory chip can further include a high voltage source. The high voltage source that can be operable to apply a pulse individually to the graphene drum in the graphene memory chip cells to switch the graphene drum from the "on" position to the "off" position.

The memory chip can further include a trace system. The trace system can include at least a first trace and a second trace. A graphene drum in the plurality of graphene-drum memory chip cells can be in the "on" position when the graphene drum is in a stable equilibrium between the van der Waals forces caused by the first trace and a mechanical restoration force. The graphene drum in the plurality of graphene-drum memory chip cells can be in the "off" position when the graphene drum is in a stable equilibrium between the van der Waals forces caused by the second trace and the mechanical restoration force.

The graphene drum does not need to contact the first trace when in the first position. The graphene drum does not need to contact the second trace when in the second position.

The graphene drum can be operable to receive a voltage such that a thermal amplitude of the graphene drum can cause an AC tunneling current that can be detected to determine whether the graphene drum is in the "on" position or the "off" position.

The memory chip can further include a trace system having at least a first trace and a second trace. The first trace can be in contact with a first layer of oxide positioned between the first trace and the graphene drum. The first layer of oxide can be in contact with a first layer of metal positioned between the first layer of oxide and the graphene drum.

A graphene drum in the plurality of graphene-drum memory chip cells can be in a first position when the graphene drum is contacting the first layer of metal. The graphene drum in the plurality of graphene-drum memory chip cells can be in a second position when the graphene drum is not contacting the first layer of metal. The first position and second position can be (a) the "on" position and the "off" position, respectively, or (b) the "off" position and the "on" position, respectively.

The second trace can be contacted with a second layer of oxide positioned between the second trace and the graphene drum. The second layer of oxide can be contacted with a second layer of metal positioned between the second layer of oxide and the graphene drum.

The memory chip can have a plurality of layers. Each layer of the plurality layers can include an array of graphene drums. Each layer of the plurality layers can include a plurality of graphene-drum memory chip cells. Each of the graphene-drum memory chip cells can include at least one graphene drum of the plurality of graphene drums.

Some of the electrically conductive drums of the memory chip can have particles of material on one side. The electrically conductive drums that have particles can have an altered resonant frequency due to the particles there upon.

The particles of material can be balls of materials.
The electrically conductive drums can be graphene drums.
The material of the particles can be a metal.
The particles can be particles of sputtered metal.
The amount of alteration of the resonant frequency of the electrically conductive drums can depend on the number, size, and location of the particles upon the electrically drums.

The memory chip can further include a trace system having at least a first trace and a second trace. The first trace can be in contact of at least one non-conductive feature positioned between the first trace and the graphene drum.

The non-conductive feature can be an oxide feature.

A graphene drum in the plurality of graphene-drum memory chip cells can be in a first position in which the graphene drum is contacting the non-conductive feature when the graphene drum is in the first position. The graphene drum in the plurality of graphene-drum memory chip cells can be in a second position in which the graphene drum is not contacting the non-conductive feature when the graphene drum is in the second position. The first position and second position can be (a) the "on" position and the "off" position, respectively, or (b) the "off" position and the "on" position, respectively.

The particles are operable for enabling a field emission current to flow between the graphene drum and the second trace.

In general, in another aspect, the invention features a method of reading a memory state of an electrically conductive drum in an electrically conductive memory chip cell. The electrically conductive drum is operable for moving between a first position and a second position. The method includes applying a voltage between the electrically conductive drum and a nearby electrically conductive member that can cause a tunneling current due to the thermal amplitude of the graphene drum. The method further includes sensing the frequency of the tunneling current. The method further includes determining whether the electrically conductive drum is in the first position or the second position. The first position and second position are (a) the "on" position and the "off" position, respectively, or (b) the "off" position and the "on" position, respectively.

Implementations of the invention can include one or more of the following feature The electrically conductive drum can be a graphene drum.

The electrically conductive drum can be in a first position in which the electrically conductive drum is contacting the electrically conductive member when the electrically conductive drum is in the first position. The electrically conductive drum can be in a second position in which the electrically conductive drum is not contacting the electrically conductive member when the electrically conductive drum is in the second position.

The second position can be a stable equilibrium position where van der Waals forces are balanced with mechanical restoration forces upon the electrically conductive drum when positioned at the second position.

The electrically conductive drum can be in a first position in which the electrically conductive drum is not contacting the electrically conductive member when the electrically conductive drum is in the first position. The electrically conductive drum can be in a second position in which the electrically conductive drum is not contacting the electrically conductive member when the electrically conductive drum is in the second position.

The first position can be a first stable equilibrium position where van der Waals forces are balanced with mechanical restoration forces upon the electrically conductive drum when positioned at the first position. The second position can be another stable equilibrium position where the van der Waals forces are balanced with the mechanical restoration forces upon the electrically conductive drum when positioned at the second position.

The electrically conductive member can be in contact with a first layer of oxide positioned between the electrically conductive member and the electrically conductive drum. The first layer of oxide can be in contact with a first layer of metal positioned between the first layer of oxide and the electrically conductive drum.

The electrically conductive drum can be in a first position when the electrically conductive drum is contacting the first layer of metal when the electrically conductive drum is in the first position. The electrically conductive drum can be in the second position when the electrically conductive drum is not contacting the first layer of metal when the electrically conductive drum is in the second position.

A second electrically conductive member nearby the electrically conductive drum can be contacted with a second layer of oxide positioned between the second electrically conductive member and the electrically conductive drum. The second layer of oxide can be contacted with a second layer of metal positioned between the second layer of oxide and the electrically conductive drum.

The method can further include selecting the electrically conductive drum using a selection trace system operatively connected to the electrically conductive drum memory chip cell. The selection trace system can include a plurality of selection traces. The electrically conductive drum memory chip cell can be operably connected to a corresponding pair of selection traces in the selection traces such that the electrically conductive memory chip cell can be individually selected by selecting the corresponding pair of selection traces for the electrically conductive drum memory chip cell.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

DETAILED DESCRIPTION

Figure 1:
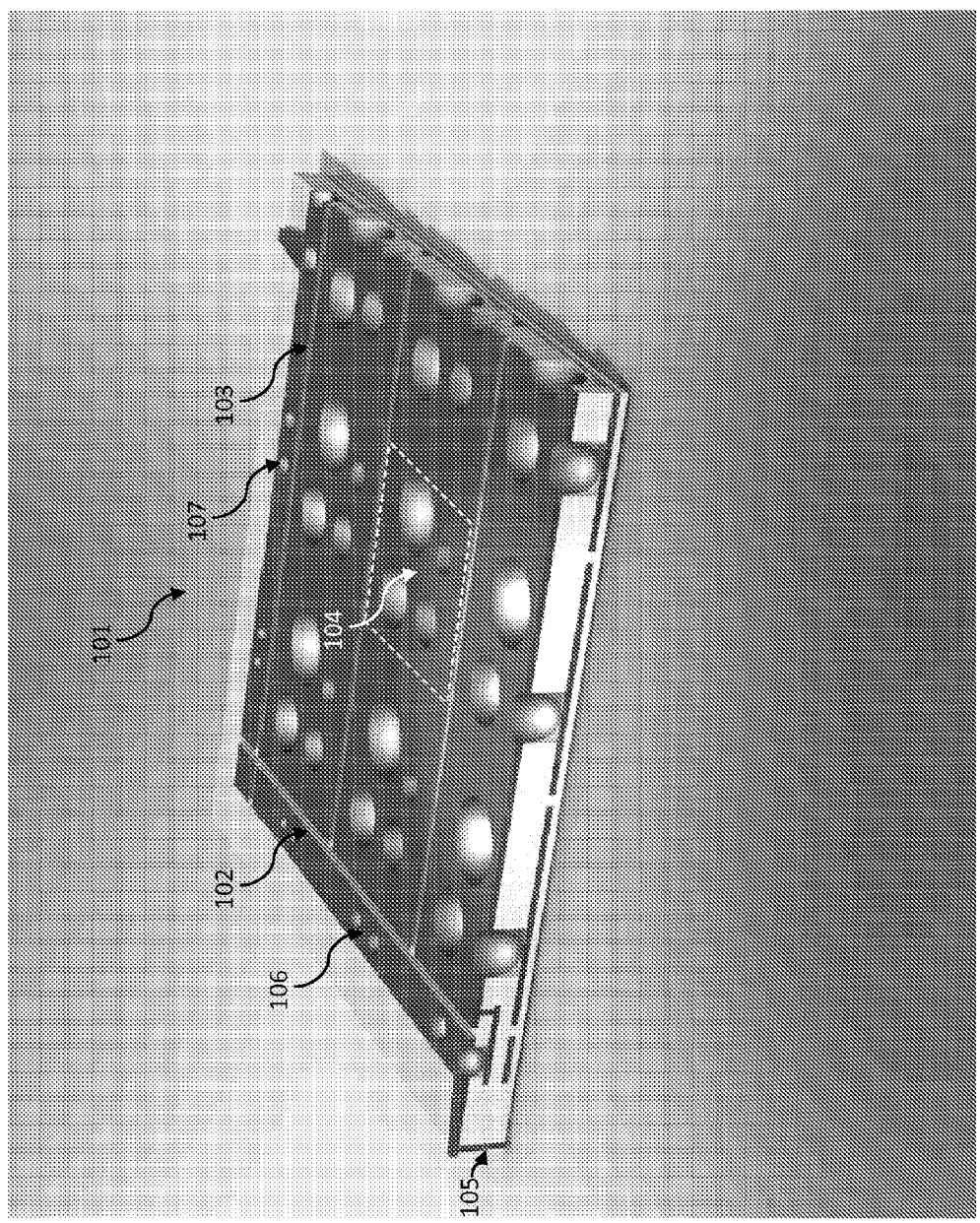
FIG. 1 depicts a cutaway view of a single graphene-drum memory chip layer of a graphene-drum memory chip.

In an embodiment of the present invention, one or more graphene drums can be utilized in a graphene-drum memory chip. FIG. 1 depicts a cutaway view of a single graphene-drum memory chip layer 101 of a graphene-drum memory chip.

The small drum traces on the left and top of the chip (selection traces 102 and 103) are used to select a given row or column of the device. For example, to access the center cell (cell 104, which contains four graphene drums), one would apply an AC signal with a DC component (via two pins, one of which (pin 105) is visible in first figure) to the upper and lower layers of the left selection trace (selection trace 102) that matches the mechanical resonant frequency of the middle graphene drum pair 106 (pair is for redundancy). These two redundant graphene drums would then vibrate up/down until they contacted a middle trace which is electrically connected to the middle row in figure. The DC component would help the graphene drums to pull down toward the conductive trace and also help the graphene drum stay engaged with the conductive trace once contact is made.

Applying another AC (with a DC component) signal between the upper and lower layers of the top selection trace (selection trace 103) that matches the mechanical resonant frequency of the middle graphene drum pair 1-7 vibrates these drums up/down until they contacted a middle trace (which is electrically connected to the middle column) in figure. At this point, the upper left selection trace 102 is electrically connected to the middle row and the upper top selection trace 103 is electrically connected to the middle column. The four larger graphene drums (in cell 104) that have the active row and column are the "graphene-drum memory chip cell."

To read the memory state (on or off) of each graphene drum within a cell, an AC voltage is applied to the two selection traces at a frequency that matches a given graphene drum within a cell. If the graphene drum is free (not stuck down to a column trace), it will resonate and create an AC tunneling current that can be sensed as "off" by external circuitry (not shown); if the drum is stuck down to the column trace (which is a metallic trace with a thin layer of oxide on its surface to prevent large currents) via attractive van der Waals surface forces it will not generate an AC tunneling current and will be considered "on." A range of frequencies are applied to the cell until each graphene drum within the cell is found to be on or off. Once finished, the DC component applied to each selection trace is turned off and the graphene drums of the selection traces disengage. The process can then be repeated to read the stated of other graphene drums within other cells using the same process.

A resonating graphene drum will have a significant variation in capacitance over its range of travel that will also create a unique current response at the resonant frequency that can be used to sense the state of a graphene drum, even if tunneling current does not occur.

Another method to read the memory state of all the graphene drums within a cell simultaneously is to apply a voltage signal that contains a superposition of all of the resonant frequencies of the graphene drums. The resulting current signal can be then be parsed for individual drum responses using a set of bandpass filters, or any other suitable method of time domain or frequency domain signal processing, either with analog or digital electronics.

To change the state of graphene drums within a give cell, a relatively high voltage pulse of the same polarity is applied to a given column and row trace, resulting in an electrostatic repulsion that frees any graphene drum that was adhered to the column trace. At this point, an AC signal can be applied to the row and column traces (via the selection traces) that has a frequency that matches the mechanical frequency of a given graphene drum, forcing the graphene drum to resonate until it contacts and adheres to the column trace. A different AC frequency can be used to make a different graphene drum within a cell adhere to the column trace.

Figure 2:
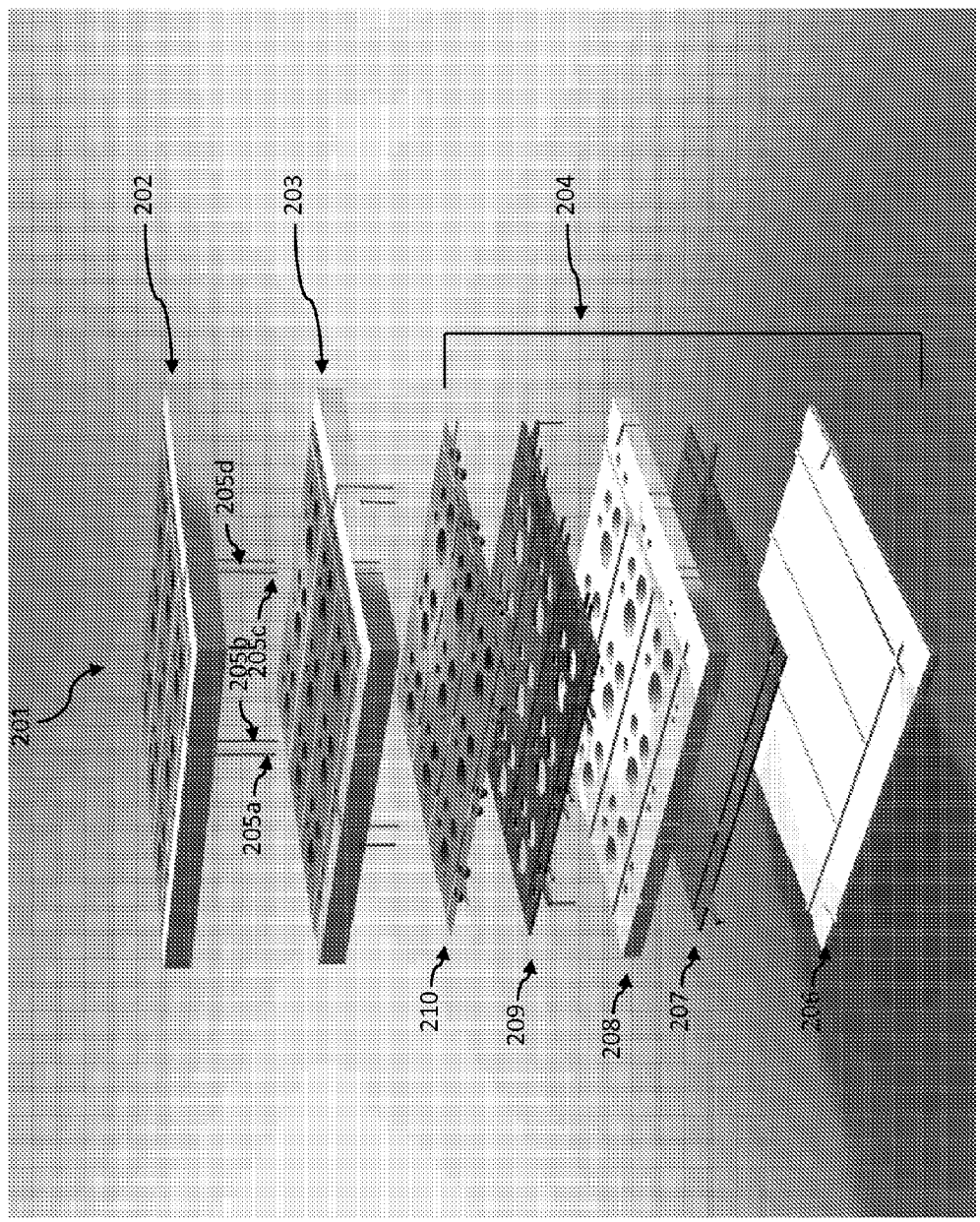
FIG. 2 depicts a detailed view illustrating how three graphene-drum layers can be stacked in a graphene-drum memory chip.
Figure 3:
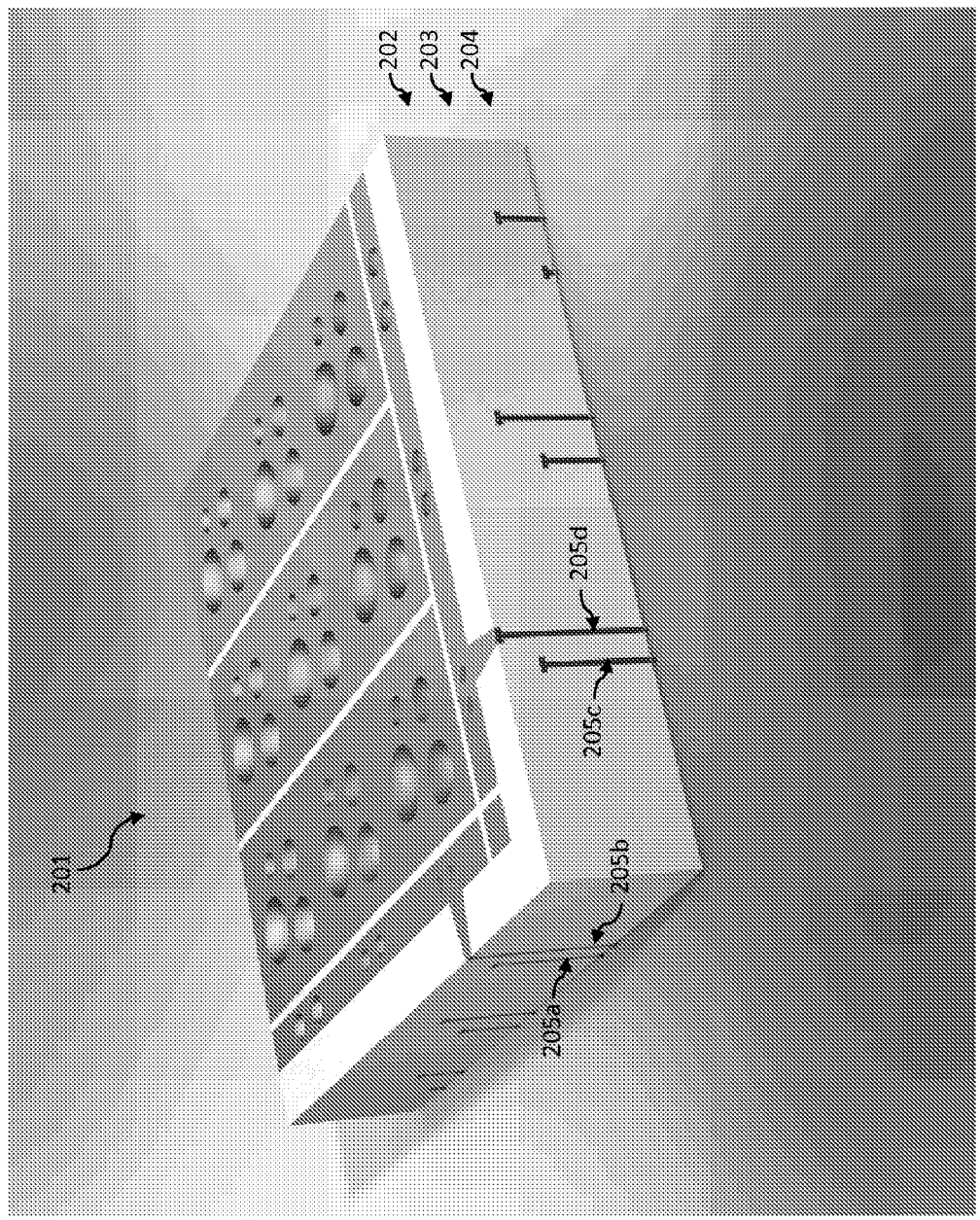
FIG. 3 depicts the stacked graphene-drum memory chip of FIG. 2.

FIG. 2 depicts a detailed view illustrating how three graphene-drum layers can be stacked in a graphene-drum memory chip, and FIG. 3 depicts this stacked graphene-drum memory chip. As can be seen in FIGS. 2-3, it is possible to stack many layers (three layers 202, 203, and 204 are shown) together to achieve very high storage per unit area. Layer 204 is shown in detail illustrating the graphene sheet 210 (having the graphene drums), the metal sheets 209 and 207, and oxide sheet 208. Each of layers 202, 203, and 204 has four via pins that make their way to the bottom of the chip 206 for easy access to a circuit board. For example, Layer 202 has pins 205a, 205b, 205c, and 205d.

Figure 4:
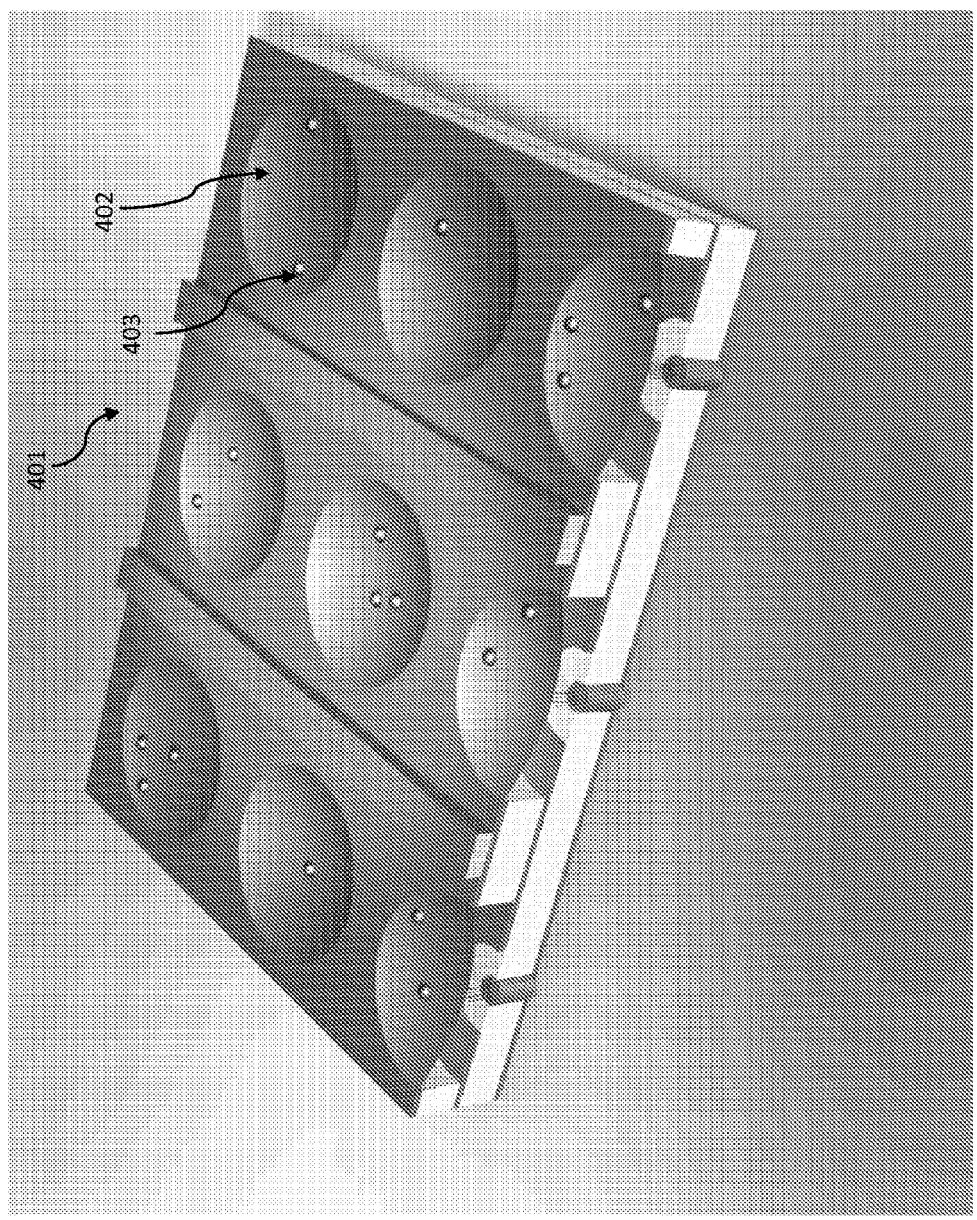
FIG. 4 depicts an embodiment of the present invention in which the graphene-drum memory chip has graphene drums whose resonant frequency has been altered by the addition of small balls of material on a side of the graphene drums.

FIG. 4 depicts a graphene-drum memory chip 401 that has graphene drums 402 whose resonant frequency has been altered by the addition of small balls 403 of material on a side of the graphene drums. Such balls of material can be made of metal. Such balls can be added by a sputtering process, which can be designed to control the number, size, and location of the balls. The number, size, and location of the balls on the graphene drum will alter the resonant frequency of the graphene drum.

Figure 5A:
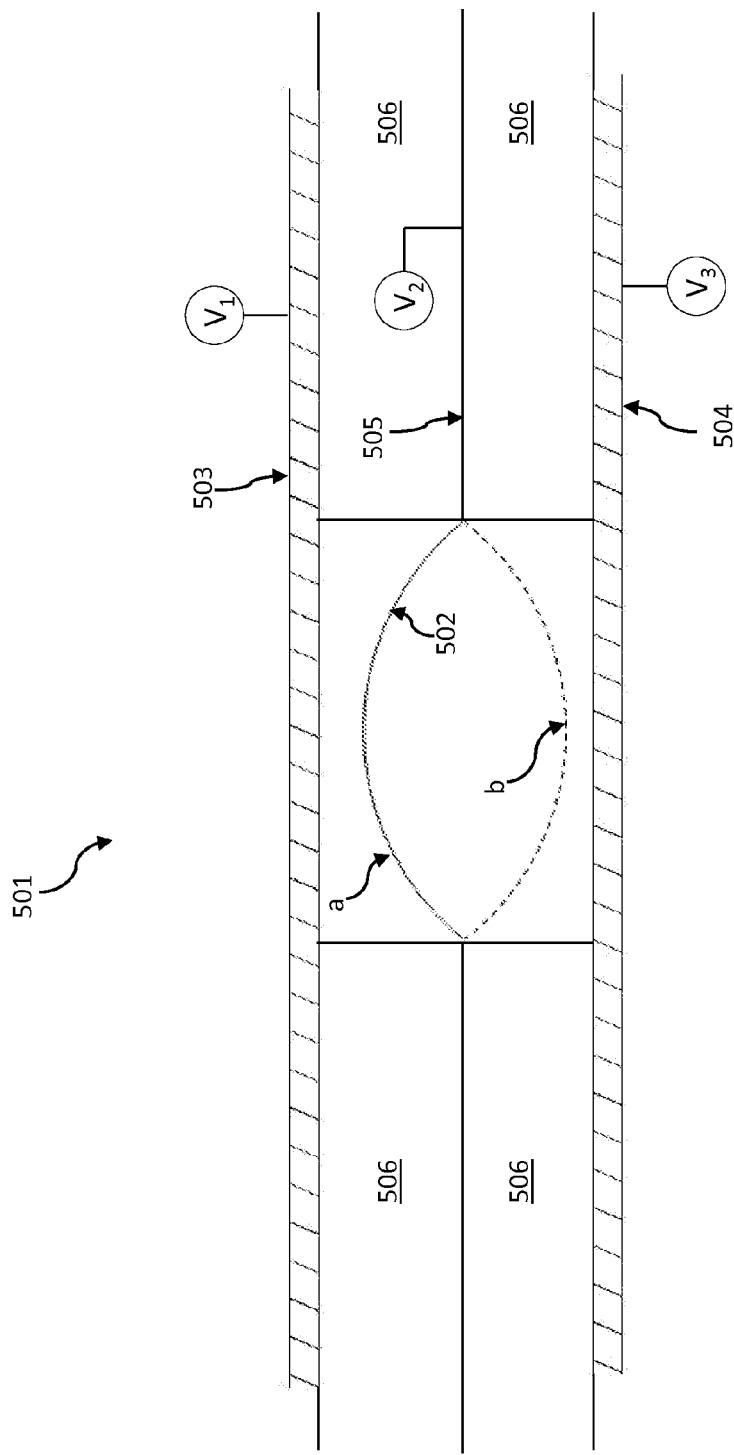
FIGS. 5A-5D depict several graphene-drum memory chip cells of the present invention.

FIG. 5A depicts a graphene-drum memory chip cell 501 that does not require the graphene drum to physically contact with the metal traces. As shown in the graphene-drum memory chip cell 501 of FIG. 5A, a small graphene drum 502 (such as a 5-100 nanometer diameter graphene drum) can move up toward trace 503 (as illustrated in the first position "a" of graphene drum 502 shown by the solid line) or down toward trace 504 (as illustrated in the second position "b" of graphene drum 502 shown by the dashed line). When the graphene drums are this small, there can be a stable equilibrium between (shown as the first position "a and the second position "b" in FIG. 5A) the van der Waals force and mechanical restoration force that does not require physical contact between the graphene membrane and metal trace 503 or metal trace 504. For example, first position "a" could be the "off" state for this particular graphene drum and second position "b" could be the "on" state.

To read the memory state, a DC voltage can be applied between the graphene 505 (which is between the oxide 506) and trace 503. The thermal amplitude of the graphene drum 502 (such as in on the order of 1 angstrom) will cause an AC tunneling current at a certain frequency that can be sensed to determine that a particular graphene drum within a cell is in a given state ("off" in the instance illustrated in FIG. 5A). To change the state of the pictured graphene drum from "off" (i.e., position "a") to "on" (i.e., position "b"), a DC voltage with an AC voltage component (with a frequency near the mechanical resonant frequency of the target graphene-drum) is applied between trace 504 and the graphene 505. After a short time, the graphene drum 502 will move from "off" (i.e., position "a") to "on" (i.e., position "b") (wherein position "b" is another non-contact stable equilibrium position where van der Waals forces are balanced with mechanical restoration forces).

An advantage of the embodiment illustrated in FIG. 5A is that no physical contact is required for any state (thus no mechanical wear). Another advantage is that both the "on" and "off" states can be rapidly read with a DC voltage and that all the graphene drums within a cell can be read at the same time. Each graphene drum within a cell will give off an AC tunneling current at a particular frequency that can be sensed/differentiated by an external circuit just as radio waves of different frequencies can be sensed by a single radio receiver.

Figure 5B:
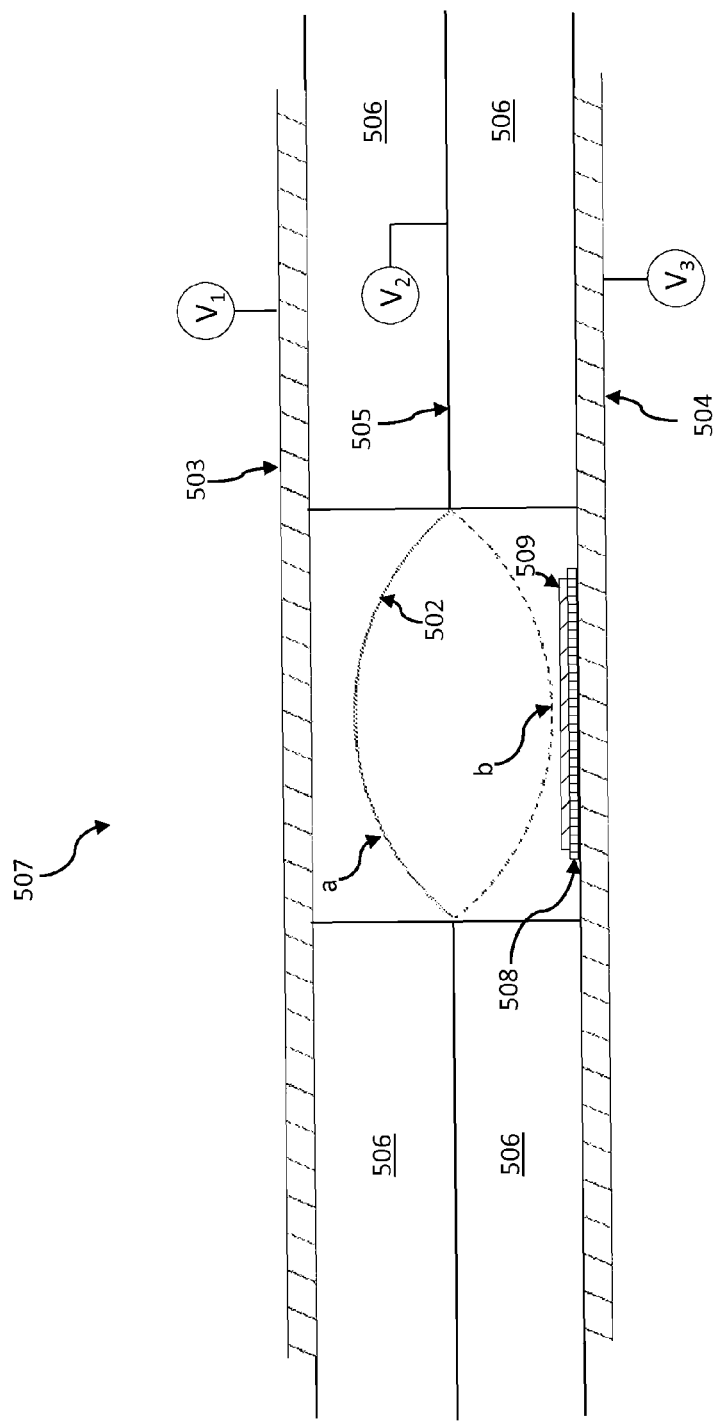

FIG. 5B depicts another graphene-drum memory chip cell 507. As shown in FIG. 5B, graphene-drum memory chip cell 507 is arranged similar to the graphene-drum memory chip cell 501 shown in FIG. 5A, in which a thin layer of oxide 508 (such as an oxide disk) is added to metal trace 504 on the side facing graphene drum 502. The thickness of this thin layer of oxide 508 can be around a few angstroms (i.e., around 1 to 3 angstroms). On the side of the thin layer of oxide 508 facing the graphene drum 502 is a layer of metal 509 (such as a metal disk). The thickness of the layer of metal 509 can be a few nanometers (i.e., around 1 to 3 nm).

When graphene-drum memory chip cell 507 is read, the graphene membrane 502 comes within field emission (FE) or tunneling current range of the metal layer 509 and current flows into the metal layer 509, through the oxide layer 508 and into metal trace 504. Because the effective resistance of the oxide layer 508 is high, there will be a large voltage drop between the metal layer 509 and metal trace 504 when current is flowing, which in turn lowers the electrostatic attraction between the graphene membrane 502 and the metal layer 509. Again, due to a balance between van der Waals forces, electrostatic forces, and mechanical restoration forces, the graphene drum 502 will be at a stable equilibrium position near the metal layer that is within FE or tunneling current range.

A thermal oscillation (or an induced oscillation) of the graphene membrane will cause an AC FE/tunneling current that has an electrical frequency equal to the mechanical resonant frequency of graphene drum 502. In this position, the graphene drum 502 is considered to be in an "on" state. In cells that have multiple graphene drums, even though the array of graphene drums within that memory chip cell may have different mechanical properties (such as stiffness), the graphene drums will each establish a precise FE/tunneling distance between themselves and the metal layer due the voltage drop effect described above.

To write the memory element shown in FIG. 5B, an AC voltage (with an electrical frequency equal to the mechanical resonant frequency of graphene drum 502) between $V_2$ and $V_3$ is used to force graphene drum 502 to mechanically oscillate much more than the other graphene drums connected to trace 503 and metal trace 504. Eventually, graphene drum 502 will come so close to the metal layer 509 that van der Waals forces will pull graphene drum 502 into the metal layer 509 and graphene drum 502 will "stick" on the metal layer 509. At this point, graphene drum 502 cannot mechanically oscillate and will thus be in an "off" state. To switch graphene drum 502 back into an "on" state, a voltage V1 on upper gate 503 can be used to pull graphene drum 502 off of the metal layer 509 with an electrostatic force and allow it to remain in a free state (where it can be read as described above).

Figure 5C:
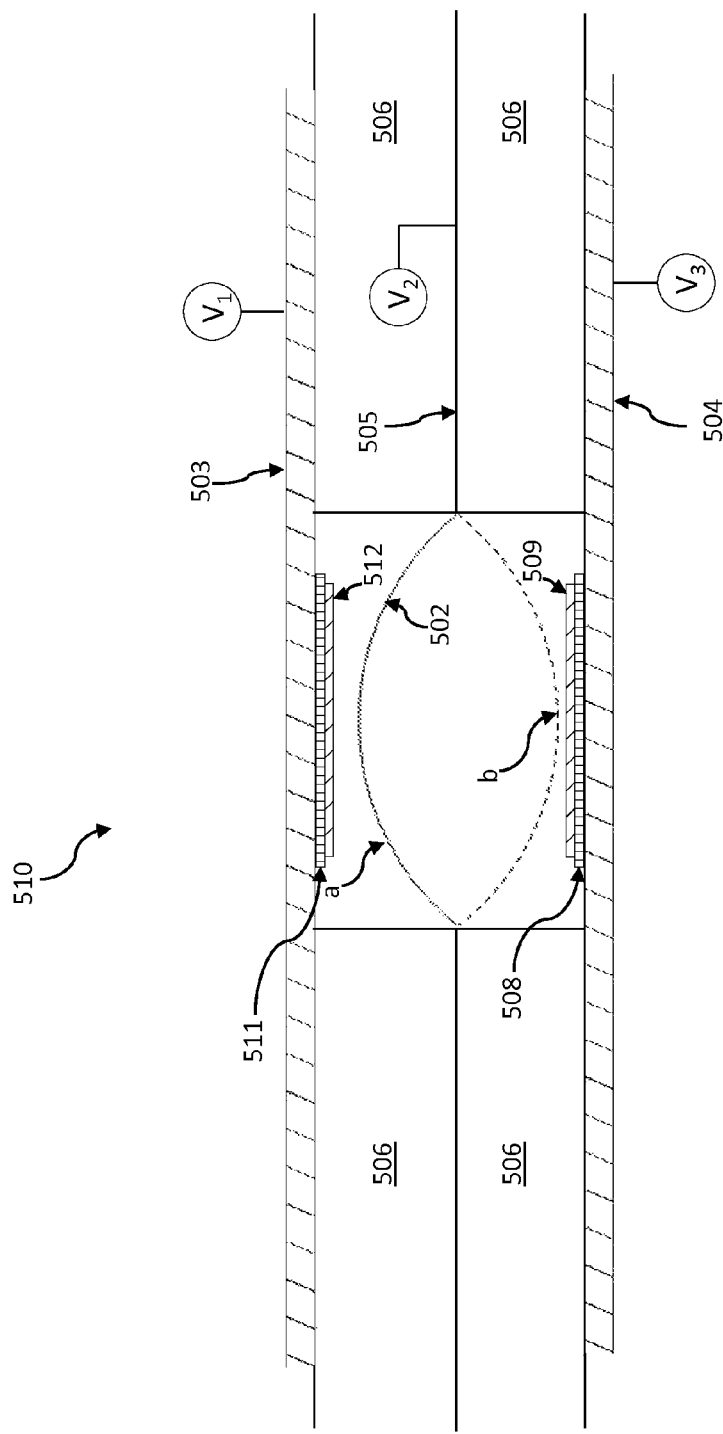

FIG. 5C depicts another graphene-drum memory chip cell 510. As shown in FIG. 5C, graphene-drum memory chip cell 510 is arranged similar to the graphene-drum memory chip cell 501 shown in FIG. 5B, in which a thin layer of oxide 511 (such as an oxide disk) is added to trace 503 on the side facing graphene drum 502. Like oxide 508, the thickness of this thin layer of oxide 511 can also be around a few angstroms (i.e., around 1 to 3 angstroms). On the side of the thin layer of oxide 511 facing the graphene drum 502 is a layer of metal 512 (such as a metal disk). Like metal layer 509, the thickness of the layer of metal 512 can be a few nanometers (i.e., around 1 to 3 nm).

Graphene-drum memory chip cell 510 can be used just like graphene-drum memory chip cells 501 and 507, with the benefit that the metal/oxide layers on traces 503 and 504 allow graphene drum 502 to be read over a much wider range of voltages and constructed with relaxed tolerances (because the voltage drop across the oxide layers 508 and 511 allows a precise FE/tunneling gap to be established between graphene drum 502 and the metal layers 509 and 512, respectively, even if each graphene drum in the cell has significantly different mechanical properties).

Figure 5D:
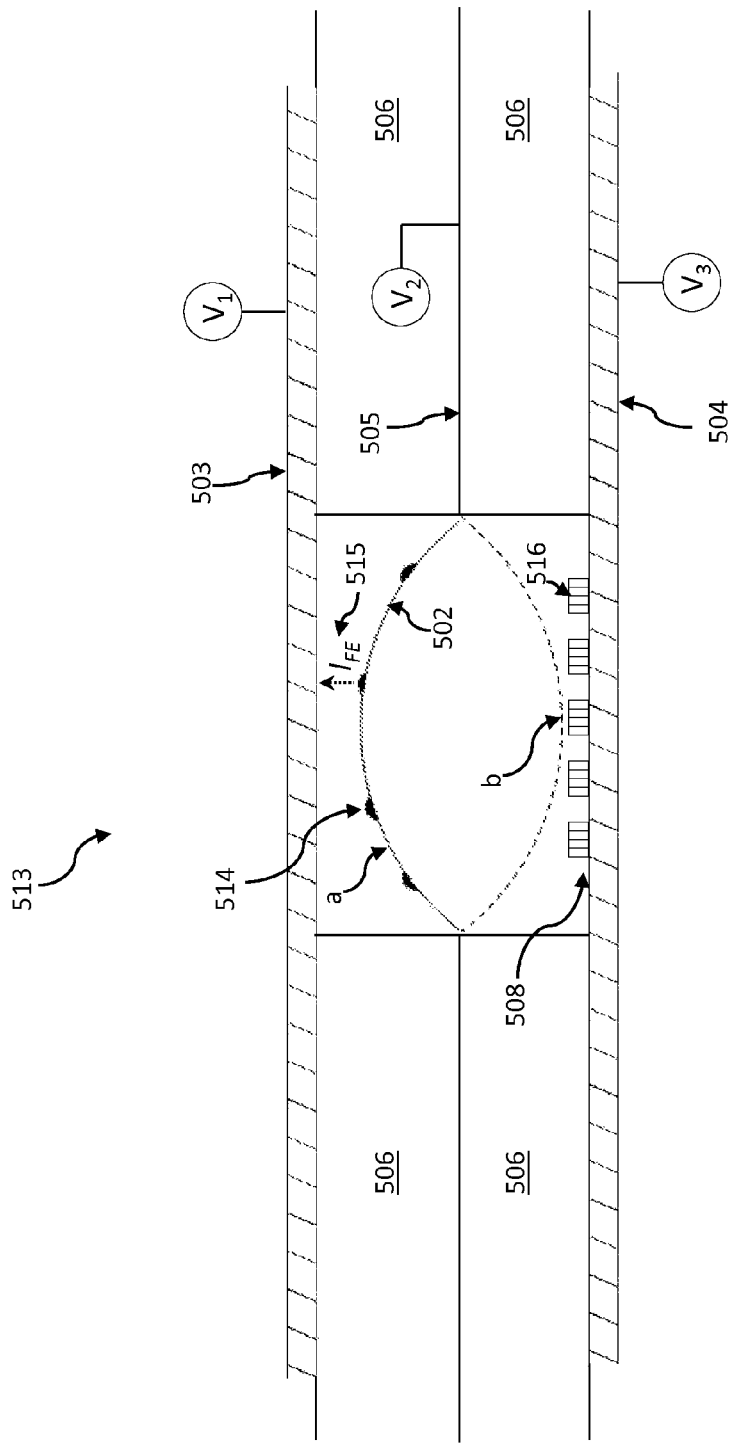

FIG. 5D depicts another graphene-drum memory chip cell 513. As shown in FIG. 5D, graphene-drum memory chip cell 513 is arranged similar to the graphene-drum memory chip cell 501 shown in FIG. 5A, in which the graphene drum 502 includes small metallic particles 514 (such as metallic dots) and trace 504 has an array of oxide features 516 on the side facing the graphene drum.

The metallic particles 514 will change the mechanical resonant frequency of the graphene drum (as discussed above). Furthermore, the metallic particles will also create an electric field "enhancement factor" that enables a field emission current ($I_{FE}$) 515 to flow between graphene drum 502 and trace 503.

This field emission current can be used to read the memory state of graphene drum 502 even when the graphene drum 502 is several nm away from trace 503. This would render the device easier to manufacture than a device that requires 3-10 angstrom tunneling current gaps.

To position the graphene drum 502 in an "off" position, an AC voltage between graphene 505 and trace 504 at an electrical frequency close to the mechanical resonant frequency of graphene drum 502 will put the graphene drum 502 in contact with an oxide feature 516. Once in contact with the oxide feature 515, graphene drum 502 will remain in this position (i.e., the graphene drum 502 will remain in the "off position") due to van der Waals forces.

To position the graphene drum 502 in an "on," a voltage can be applied between trace 503 and graphene drum 502. Once free from the oxide feature 516, graphene drum 502 will remain in an unstuck position (i.e., the "on" position). To read a graphene drum in an on position, an AC voltage between graphene 505 and trace 503 at an electrical frequency close to the mechanical resonant frequency of graphene drum 502 will put the metallic particles 514 on the graphene drum near enough to trace 503 to produce a time-varying FE current 515 that can be read/measured. When a given graphene drum cannot be read through a FE current at a certain AC voltage excitation frequency it can be assumed to be in the off position (stock on oxide feature 516).

As oriented above for FIG. 5D, first position "a" could be the "on" state for this particular graphene drum 513 and second position "b" could be the "off" state (which is opposite the orientation of "on" and "off" as defined above for FIG. 5A). The "on" and "off" states are positions relative to one another. A person of skill in the art would understand that one position can be designated as the "on" position for the graphene drum in the graphene-drum memory chip cell, and the other position as the "off" position (and vice versa).

Figure 6:
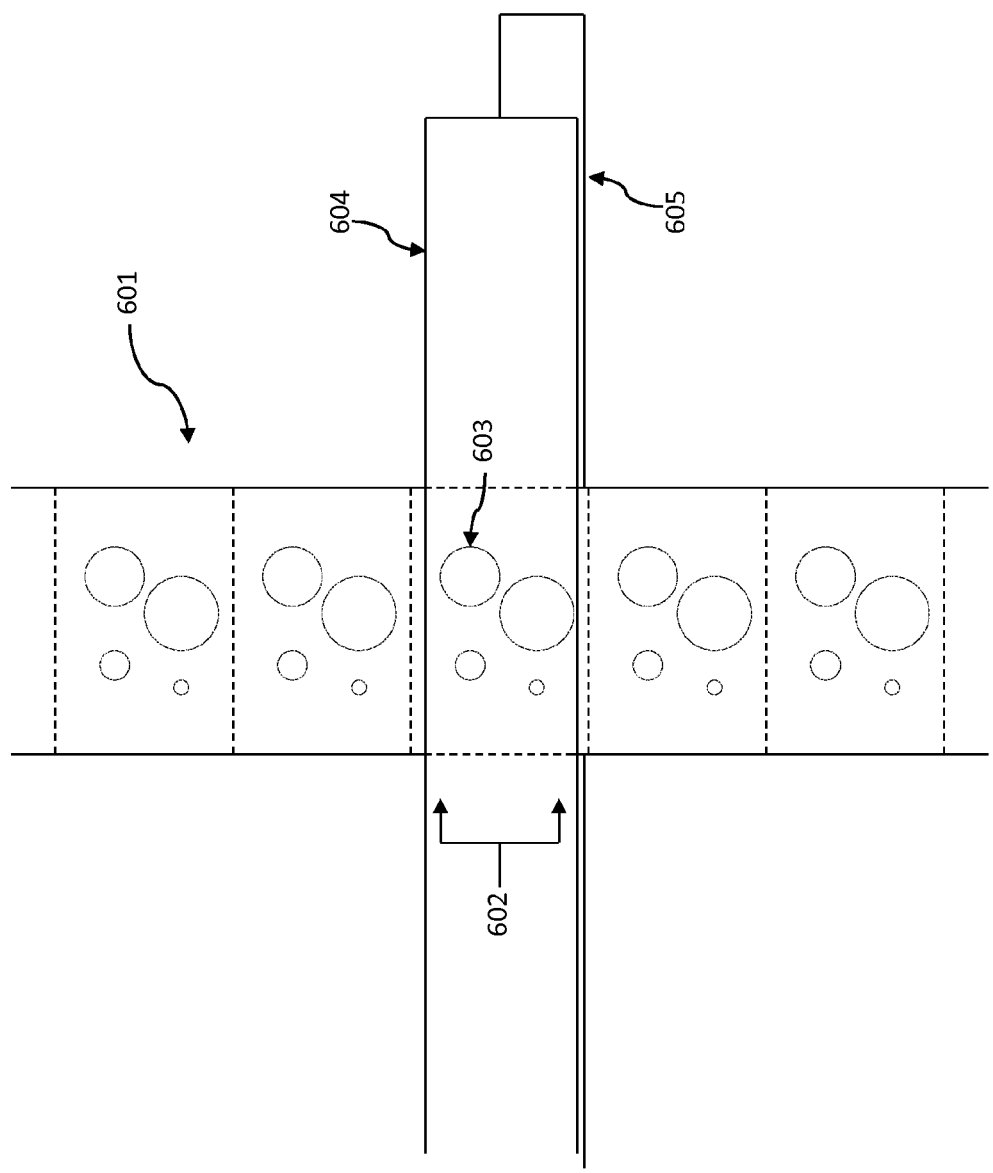
FIG. 6 depicts an embodiment of the present invention in which the graphene-drum memory chip has a voltage placed between the graphene and a trace.

FIG. 6 depicts how a given graphene drum cell 602 of an assembly 601 can be chosen by placing a voltage between the graphene of the graphene-drum cell 602 and either trace 604 or trace 605. As with the other embodiments, the graphene drums 603 within a given graphene-drum cell 602 can be individually addressed by exploiting the differences in the mechanical resonant frequency of each graphene drum 603 within the target graphene-drum cell 602. A purpose for the cross bar assembly as shown in FIG. 6 (graphene oxide assembly 601) is that it allows for the isolation of one graphene-drum cell from the other cells of the assembly 601 to limit the number of graphene drums within a given graphene cell. By such isolation, each graphene drum within a given cell can have a distinct resonant frequency without varying the size of each graphene drum (or the number and/or placement of the metallic balls) too much.

A number of embodiments of the invention have been described. Nevertheless, it will be understood that various modifications may be made without departing from the spirit and scope of the invention. Accordingly, other embodiments are within the scope of the following claims.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. For example, the selection traces could be replaced with an array of conventional silicon switches to address individual cells. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A memory chip comprising an array of electrically conductive drums that have a range of mechanical resonant frequencies that can be individually addressed with an electrical signal between said electrically conductive drums and a nearby electrically conductive member.

2. The memory chip of claim 1, wherein the array of electrically conductive drums is an array of graphene drums.

3. The memory chip of claim 2, wherein the memory chip comprises a layer, wherein the layer comprises the array of graphene drums.

4. The memory chip of claim 3, wherein the layer comprises a plurality of graphene-drum memory chip cells, wherein each of the graphene-drum memory chip cells comprise at least one graphene drum of the array of graphene drums.

5. The memory chip of claim 2, further comprising a selection trace system, wherein
(a) the selection trace system comprises a plurality of selection traces; and
(b) each of the graphene memory chip cells is operably connected to a corresponding pair of selection traces in the selection traces such that each of the graphene memory chip cells can be individually selected by selecting the corresponding pair of selection traces for the graphene-drum memory chip cell.

6. The memory chip of claim 5, wherein each of the graphene drums in the plurality of graphene-drum memory chip cells is operable to be in an "on" position and an "off" position.

7. The memory chip of claim 6, further comprising a contact trace system, wherein
(a) the contact trace system comprises at least one contact trace,
(b) a graphene drum in the plurality of graphene-drum memory chip cells is in a first position when the graphene drum is contacting at least one of the contact traces in the contact trace system;
(c) the graphene drum in the plurality of graphene-drum memory chip cells is in a second position when the graphene drum is not contacting at least one of the contact traces in the contact trace system; and (d) the first position and second position are selected from the group consisting of (a) the "on" position and the "off" position, respectively, and (b) the "off" position and the "on" position, respectively.

8. The memory chip of claim 7, further comprising a voltage source and an external circuitry, wherein the voltage source is operable to apply a voltage such that the external circuitry can determine whether the graphene drum of the plurality of graphene drum memory chip cells is in the "on" or "off" position.

9. The memory chip of claim 7, comprising a high voltage source, wherein the high voltage source that is operable to apply a pulse individually to the graphene drum in the graphene-drum memory chip cells to switch the graphene drum from the "on" position to the "off" position.

10. The memory chip of claim 2, further comprising a trace system, wherein
(a) the trace system comprises at least a first trace and a second trace;
(b) a graphene drum in the plurality of graphene-drum memory chip cells is in the "on" position when the graphene drum is in a stable equilibrium between the van der Waals forces caused by the first trace and a mechanical restoration force; and
(c) the graphene drum in the plurality of graphene-drum memory chip cells is in the "off" position when the graphene drum is in a stable equilibrium between the van der Waals forces caused by the second trace and the mechanical restoration force.

11. The memory chip of claim 10, wherein the graphene drum does not contact the first trace when in the first position, and the graphene drum does not contact the second trace when in the second position.

12. The memory chip of claim 10, wherein the graphene drum is operable to receive a voltage such that a thermal amplitude of the graphene drum can cause an AC tunneling current that can be detected to determine whether the graphene drum is in the "on" position or the "off" position.

13. The memory chip of claim 2, further comprising a trace system having at least a first trace and a second trace, wherein
(a) the first trace is in contact with a first layer of oxide positioned between the first trace and the graphene drum; and
(b) the first layer of oxide is in contact with a first layer of metal positioned between the first layer of oxide and the graphene drum.

14. The memory chip of claim 13, wherein
(a) a graphene drum in the plurality of graphene-drum memory chip cells is in a first position when the graphene drum is contacting the first layer of metal;
(b) the graphene drum in the plurality of graphene-drum memory chip cells is in a second position when the graphene drum is not contacting the first layer of metal; and
(c) the first position and second position are selected from the group consisting of (a) the "on" position and the "off" position, respectively, and (b) the "off" position and the "on" position, respectively.

15. The memory chip of claim 13, wherein
(a) the second trace is contacted with a second layer of oxide positioned between the second trace and the graphene drum; and
(b) the second layer of oxide is contacted with a second layer of metal positioned between the second layer of oxide and the graphene drum.

16. The memory chip of claim 2, wherein the memory chip has a plurality of layers, wherein each layer of the plurality layers comprises an array of graphene drums.

17. The memory chip of claim 16, wherein each layer of the plurality layers comprises a plurality of graphene-drum memory chip cells, wherein each of the graphene-drum memory chip cells comprise at least one graphene drum of the array of graphene drums.

18. The memory chip of claim 1, wherein at least some of the drums in the array of electrically conductive drums have particles of material on one side, where the electrically conductive drums that have particles have an altered resonant frequency due to the particles there upon.

19. The memory chip of claim 18, wherein the particles of material are balls of materials.

20. The memory chip of claim 18, wherein the array of electrically conductive drums is an array of graphene drums.

21. The memory chip of claim 20, further comprising a trace system having at least a first trace and a second trace, wherein the first trace is in contact at least one non-conductive feature positioned between the first trace and the graphene drum.

22. The memory chip of claim 21, wherein the non-conductive feature is an oxide feature.

23. The memory chip of claim 21, wherein
(a) a graphene drum in the plurality of graphene-drum memory chip cells is in a first position when the graphene drum is contacting the non-conductive feature;
(b) the graphene drum in the plurality of graphene-drum memory chip cells is in a second position when the graphene drum is not contacting the non-conductive feature; and
(c) the first position and second position are selected from the group consisting of (a) the "on" position and the "off" position, respectively, and (b) the "off" position and the "on" position, respectively.

24. The memory chip of claim 23, wherein the particles are operable for enabling a field emission current to flow between the graphene drum and the second trace.

25. The memory chip of claim 18, wherein the material of the particles comprises a metal.

26. The memory chip of claim 18, wherein the particles are particles of sputtered metal.

27. The memory chip of claim 18, wherein the amount of alteration of the resonant frequency of the electrically conductive drums depends on the number, size, and location of the particles upon the electrically conductive drums.

28. A method of reading a memory state of an electrically conductive drum in an electrically conductive memory chip cell, wherein the electrically conductive drum is operable for moving between a first position and a second position, the method comprising:
(a) applying a voltage between the electrically conductive drum and a nearby electrically conductive member that can cause a tunneling current due to the thermal amplitude of the graphene drum;
(b) sensing the frequency of the tunneling current; and
(c) determining whether the electrically conductive drum is in the first position or the second position, wherein the first position and second position are selected from the group consisting of (a) the "on" position and the "off" position, respectively, and (b) the "off" position and the "on" position, respectively.

29. The method of claim 28, wherein the electrically conductive drum is a grapheme drum.

30. The method of claim 28, wherein
(a) the electrically conductive drum is contacting the electrically conductive member when the electrically conductive drum is in the first position; and
(b) the electrically conductive drum is not contacting the electrically conductive member when the electrically conductive drum is in the second position.

31. The method of claim 30, wherein the second position is a stable equilibrium position where van der Waals forces are balanced with mechanical restoration forces upon the electrically conductive drum when positioned at the second position.

32. The method of claim 28, wherein
(a) the electrically conductive drum is not contacting the electrically conductive member when the electrically conductive drum is in the first position; and
(b) the electrically conductive drum is not contacting the electrically conductive member when the electrically conductive drum is in the second position.

33. The method of claim 32, wherein
(a) the first position is a first stable equilibrium position where van der Waals forces are balanced with mechanical restoration forces upon the electrically conductive drum when positioned at the first position; and
(b) the second position is another stable equilibrium position where the van der Waals forces are balanced with the mechanical restoration forces upon the electrically conductive drum when positioned at the second position.

34. The method of claim 28, wherein
(a) the electrically conductive member is in contact with a first layer of oxide positioned between the electrically conductive member and the electrically conductive drum; and
(b) the first layer of oxide is in contact with a first layer of metal positioned between the first layer of oxide and the electrically conductive drum.

35. The method of claim 34, wherein
(a) the electrically conductive drum is in the first position when the electrically conductive drum is contacting the first layer of metal; and
(b) the electrically conductive drum in the plurality of graphene-drum memory chip cells is in the second position when the electrically conductive drum is not contacting the first layer of metal.

36. The method of claim 34, wherein
(a) a second electrically conductive member nearby the electrically conductive drum is contacted with a second layer of oxide positioned between the second electrically conductive member and the electrically conductive drum; and
(b) the second layer of oxide is contacted with a second layer of metal positioned between the second layer of oxide and the electrically conductive drum.

37. The method of claim 28 further comprising selecting the electrically conductive drum using a selection trace system operatively connected to the electrically conductive drum memory chip cell, wherein:
(a) the selection trace system comprises a plurality of selection traces, and
(b) the electrically conductive drum memory chip cell is operably connected to a corresponding pair of selection traces in the selection traces such that the electrically conductive memory chip cell can be individually selected by selecting the corresponding pair of selection traces for the electrically conductive drum memory chip cell.

* * * * *